(12) United States Patent
Xu

(10) Patent No.: US 11,462,569 B2
(45) Date of Patent: Oct. 4, 2022

(54) DISPLAY PANEL AND METHOD OF FABRICATING SAME

(71) Applicant: Wuhan China Star Optoelectronics Semiconductor Display Technology Co., LTD., Hubei (CN)

(72) Inventor: Zuzhao Xu, Wuhan (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 117 days.

(21) Appl. No.: 16/622,107

(22) PCT Filed: Sep. 20, 2019

(86) PCT No.: PCT/CN2019/106846
§ 371 (c)(1),
(2) Date: Dec. 12, 2019

(87) PCT Pub. No.: WO2021/027017
PCT Pub. Date: Feb. 18, 2021

(65) Prior Publication Data
US 2021/0288080 A1    Sep. 16, 2021

(30) Foreign Application Priority Data
Aug. 13, 2019 (CN) .......................... 201910744669.4

(51) Int. Cl.
*H01L 27/12*  (2006.01)

(52) U.S. Cl.
CPC ........ *H01L 27/1237* (2013.01); *H01L 27/127* (2013.01)

(58) Field of Classification Search
CPC .............. H01L 27/1237; H01L 27/127; H01L 27/1248; H01L 27/124
See application file for complete search history.

(56) References Cited

U.S. PATENT DOCUMENTS

| 2016/0233253 | A1* | 8/2016 | Kim ..................... H01L 27/1255 |
| 2018/0122835 | A1* | 5/2018 | Watakabe ........... H01L 27/1251 |
| 2019/0115407 | A1* | 4/2019 | Cho ..................... H01L 27/3262 |
| 2020/0006680 | A1  | 1/2020 | Fang |

FOREIGN PATENT DOCUMENTS

| CN | 108899342 A | 11/2018 |
| CN | 108962946 A | 12/2018 |
| CN | 109671761 A | 4/2019 |
| CN | 109860252 A | 6/2019 |
| CN | 110047381 A | 7/2019 |
| KR | 20090032926 A | 4/2009 |

* cited by examiner

*Primary Examiner* — Mohammed R Alam
(74) *Attorney, Agent, or Firm* — Benesch, Friedlander, Coplan & Aronoff LLP

(57) ABSTRACT

A display panel and a method for fabricating the same are provided, the display panel including a substrate, a first insulating layer on the substrate, a source-drain layer on the first insulating layer, and a flexible layer pattern. The source-drain layer includes sources and drains. The flexible layer pattern includes at least one opening, the sources and the drains of the display panel are arranged in the openings, and the at least one opening corresponds to at least one of the sources and at least one of the drains.

13 Claims, 7 Drawing Sheets

DISPLAY PANEL AND METHOD OF FABRICATING SAME

FIELD OF INVENTION

The present application relates to the field of display, and in particular, to a display panel and a method of fabricating the same.

BACKGROUND OF INVENTION

With development of technology, appearance of mobile electronic devices has undergone tremendous changes. Among them, flexible screens have attracted much attention due to their unique characteristics and huge potential. Compared with traditional screens, flexible screens are flexible and bendable, which can reduce the extent of accidental damage to the equipment and are much more durable than other screens.

In order to ensure the flexibility of products, present flexible screens are usually filled with a flexible material between a gate layer and a source-drain layer. In thin film transistor (TFT) structure, the increase of a flexible layer causes depths of contact holes between sources/drains and an active layer become longer, risk of disconnection may occur while the sources/drains are formed and reduces product yield.

Therefore, there is a need for a display panel to solve the above technical problems.

SUMMARY OF INVENTION

The present application provides a display panel and a fabricating method thereof to solve the technical problem that sources/drains of present display panels are broken.

To solve the above problems, the technical solution provided by the present application is as follows.

The present application provides a method of fabricating a display panel, including:

forming a gate layer pattern on a substrate and a first insulating layer on the gate layer pattern;

forming at least one recess and at least one first via on the display panel by an etching process;

forming a flexible layer on the first insulating layer, the flexible layer filling the at least one first via and the at least one recess;

patterning the flexible layer to remove a portion of a flexible material in a display area of the display panel to form a flexible layer pattern; and forming sources and drains on the first insulating layer as a same layer as the flexible layer pattern.

In the fabricating method of the present application, forming the at least one recess and the at least one first via on the display panel by the etching process includes:

forming a first opening in a curved region of the display panel by a first etching process;

forming a second opening in the curved region of the display panel by a second etching process;

wherein an orthographic projection area of the first opening on the substrate is greater than an orthographic projection area of the second opening on the substrate.

In the fabricating method of the present application, the display panel includes at least two thin film transistors, the at least one first via is disposed between the two adjacent thin film transistors, or at least one of thin film transistors is disposed between two adjacent first vias.

In the fabricating method of the present application, patterning the flexible layer to remove the portion of the flexible material in the display area of the display panel to form the flexible layer pattern includes:

patterning the flexible layer by a photomask process, forming at least a third opening on the flexible layer to form the flexible layer pattern;

the third opening corresponded to at least one of the sources and at least one of the drains.

In the fabricating method of the present application, patterning the flexible layer to remove the portion of the flexible material in the display area of the display panel to form the flexible layer pattern includes:

patterning the flexible layer by a photomask process, retaining the flexible material corresponded to the at least one recess and the at least one first via to form the flexible layer pattern;

wherein the flexible layer includes a first region and a second region, the first region corresponds to the at least one first via, and the second region corresponds to the at least one recess.

The present application also provides a display panel, including a substrate; a first insulating layer disposed on the substrate; a source-drain layer and a flexible layer pattern disposed on the first insulating layer; wherein the source-drain layer includes sources and drains, the flexible layer pattern includes at least one opening, the sources and the drains of the display panel are arranged in the openings, and the at least one opening corresponds to at least one of the sources and at least one of the drains.

In the display panel of the present application, the display panel further including a curved region, wherein at least one recess is disposed in the curved region, the at least one recess is filled with a flexible material same as the flexible layer pattern, and the at least one recess includes a second opening and a first opening disposed on the second opening, wherein an orthographic projection area of the first opening on the substrate is greater than an orthographic projection area of the second opening on the substrate.

In the display panel of the present application, the display panel further including:

at least one first via, wherein the at least one first via is filled with a flexible material same as the flexible layer pattern;

at least two adjacent thin film transistors, wherein the at least one first via is disposed between the two adjacent thin film transistors, or at least one of thin film transistors is disposed between two adjacent first vias.

In the display panel of the present application, the flexible layer pattern includes at least a third opening, at least one of the sources and at least one of the drains are arranged in the third opening.

In the display panel of the present application, the flexible layer pattern includes a first region corresponding to at least one first via and a second region corresponding to at least one recess.

In the display panel of the present application, the display panel further including a protective layer disposed on a side of the flexible layer pattern away from the substrate.

The application also proposes a display module, which includes a display panel, and a polarizer layer and a cover layer disposed on the display panel, the display panel including a substrate; a first insulating layer disposed on the substrate; a source-drain layer and a flexible layer pattern disposed on the first insulating layer; wherein the source-drain layer includes sources and drains, the flexible layer pattern includes at least one opening, the sources and the drains of the display panel are arranged in the openings, and the at least one opening corresponds to at least one of the sources and at least one of the drains.

In the display module of the present application, the display panel further includes a curved region, at least one recess is disposed in the curved region, and the at least one recess is filled with a flexible material as the flexible layer pattern, wherein the at least one recess further includes a second opening and a first opening disposed on the second opening, and an orthographic projection area of the first opening on the substrate is greater than an orthographic projection area of the second opening on the substrate.

In the display module of the present application, the display panel further includes at least one first via, the at least one first via filled with a flexible material same as the flexible layer pattern, and at least two adjacent thin film transistors, the at least one first via disposed between the two adjacent thin film transistors, or at least one of thin film transistors disposed between two adjacent first vias.

In the display module of the present application, the flexible layer pattern includes at least a third opening, at least one of the sources and at least one of the drains are arranged in the third opening.

In the display module of the present application, the flexible layer pattern includes a first region corresponding to at least one first via and a second region corresponding to at least one recess.

In the display module of the present application, the display panel further includes a protective layer disposed on a side of the flexible layer pattern away from the substrate.

Advantageous effects: the present application removes the flexible material corresponding to positions of the sources and the drains by patterning the flexible layer on an interlayer dielectric layer, so that the sources/drains are arranged in the openings, and distances between the sources/drains and the active layer are reduced, which avoids risk of disconnection when forming the sources/drains and improves product yield.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
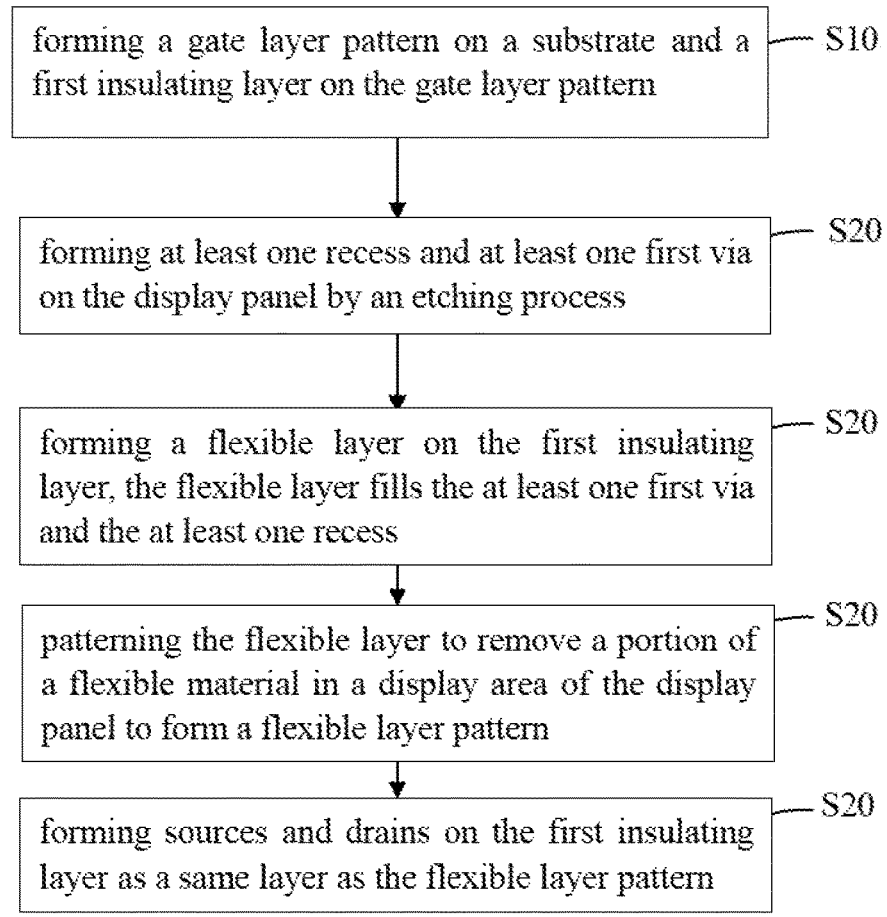
FIG. 1 is a flowchart of a method of fabricating a display panel according to an embodiment of the present application.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

In order to ensure flexibility of display panels, present flexible display panels extend a flexible material to a display area of display panels when a recess is formed in a curved region to increase flexibility of the display panels. Since a thickness of a flexible layer is greater than a thickness of a thin film transistor layer in the display panels, the increase of the flexible layer causes a depth of contact hole between sources/drains and an active layer become longer, which disconnection may occur while the sources/drains are formed. The present application proposes a display panel and a fabricating method thereof to solve the above technical problems.

Please refer to FIG. 1, where FIG. 1 is a flowchart of a method of fabricating a display panel 100 of the present application.

Please refer to FIGS. 2A to 2I, where FIG. 2A to FIG. 2I are diagrams showing the flowchart of the method of fabricating the display panel 100 of the present application.

The method of fabricating the display panel 100 includes the following steps:

A step S10, forming a gate layer pattern on a substrate 201 and a first insulating layer on the gate layer pattern.

Figure 2A:
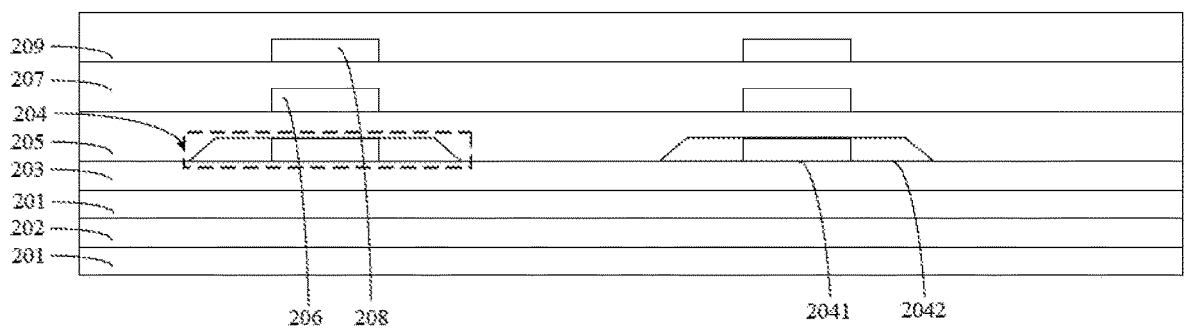
FIGS. 2A to 2I are diagrams showing the flowchart of the method of fabricating the display panel of the present application.

Referring to FIG. 2A, the step S10 can specifically include:

S101, providing the substrate 201;

S102, forming a barrier layer 202 and a buffer layer 203 on the substrate 201;

S103, forming a semiconductor layer on the buffer layer 203, and patterning the semiconductor layer to form an active layer 204;

S104, forming a first gate insulating layer 205 on the active layer 204;

S105, forming a first gate layer 206 on the first gate insulating layer 205;

S106, forming a second gate insulating layer 207 on the first gate layer 206;

S107, forming a second gate layer 208 on the second gate insulating layer 207; and S108, forming an interlayer dielectric layer 209 on the second gate layer 208.

In this embodiment, the substrate 201 can be a glass substrate, a quartz substrate, a resin substrate, and the like. The substrate 201 also can be a flexible substrate. A material of the flexible substrate can include polyimide (PI). The substrate 201 can further increase flexibility of the substrate 201 by providing a two-layer polyimide layer.

Referring to FIG. 2A, the substrate of the present application is provided with a two-layer flexible substrate 201, which the barrier layer 202 is arranged between the two-layer flexible substrate 201.

The gate layer pattern can include the first gate layer 206 and the second gate layer 208. In this embodiment, a gate layer or two gate layers can be disposed, which is not specifically limited in this application.

The first insulating layer can include the first gate insulating layer 205, the second gate insulating layer 207, and the interlayer dielectric layer 209, which is not specifically limited thereto.

The active layer 204 includes channel regions 2041 and doped regions 2042 arranged on both sides of each of the channel regions 2041. The doped region 2042 can be formed by ion implantation using a first gate in the first gate layer 206 or a second gate in the second gate layer 208 as a blocking layer.

In an embodiment of the present application, the active layer 204 can be arranged on a side of the gate layer pattern away from the substrate 201. The scheme in this embodiment compared with FIG. 2A, a distance between the active layer 204 and a source-drain layer 210 is smaller.

The materials of the above structures are all commonly used materials, and will not be described in detail herein.

A step S20, forming at least one recess 40 and at least one first via 212 on the display panel 100 by an etching process.

Figure 2B:
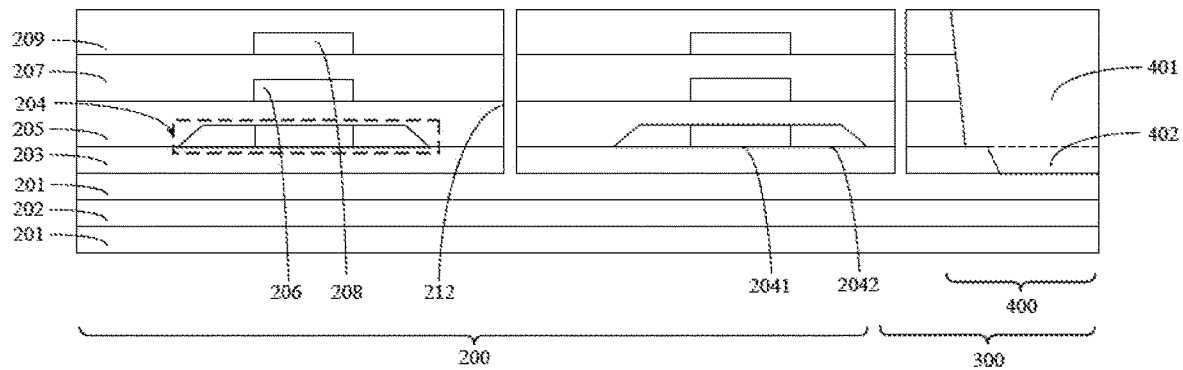

Referring to FIG. 2B, the step S20 specifically includes:

S201, forming a first opening 401 in a curved region 400 of the display panel 100 by a first etching process;

S202, forming a second opening 402 in the curved region 400 of the display panel 100 by a second etching process.

In this embodiment, an orthographic projection area of the first opening 401 on the substrate 201 is greater than an orthographic projection area of the second opening 402 on the substrate 201.

In this embodiment, the first via 212 can be formed in same processes as two etching processes for the recess 40. Or the first via 212 is formed in a third etching process, which is not specifically limited thereto.

In this embodiment, the recess 40 and the first via 212 penetrate the interlayer dielectric layer 209, the second gate insulating layer 207, the first gate insulating layer 205, and the buffer layer 203.

In this embodiment, at least one of the first vias 212 can be disposed between two adjacent thin film transistors 21. Alternatively, at least one of the thin film transistors 21 is disposed between two adjacent first vias 212. The number of the first vias 212 is not specifically limited thereto.

A step S30, forming a flexible layer 51 on the first insulating layer, the flexible layer 51 fills the at least one first via 212 and the at least one recess 40.

Figure 2C:
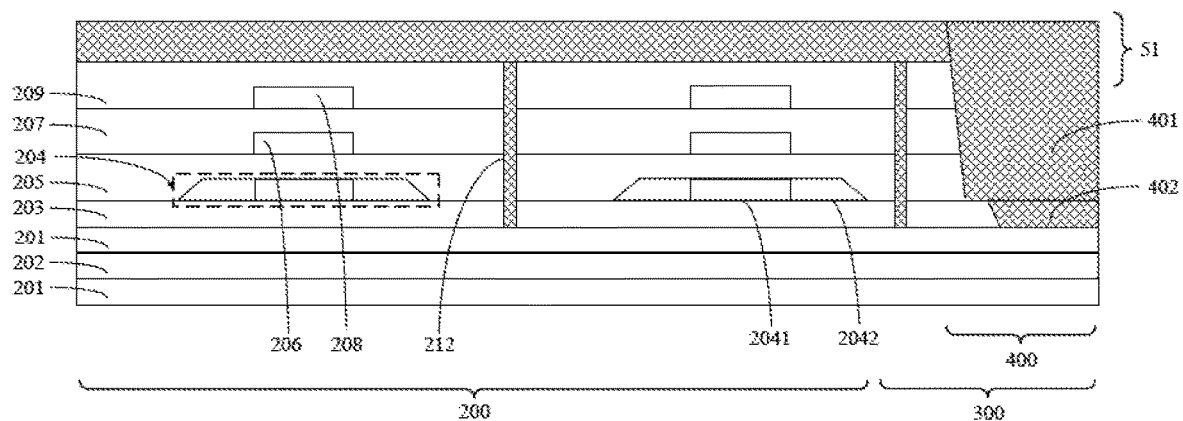

Referring to FIG. 2C, the flexible layer 51 can be composed of an organic flexible material. Since the material of the organic flexible layer 51 has a certain fluidity during fabricating, when the flexible layer 51 is formed on the interlayer dielectric layer 209, the flexible material fills the at least one first via 212 and the at least one recess 40.

In the present embodiment, a thickness of the flexible layer 51 on the interlayer dielectric layer 209 can be 1500 nanometer (nm).

A step S40, patterning the flexible layer 500 to remove a portion of a flexible material in a display area 200 of the display panel 100 to form a flexible layer pattern 500.

Figure 2D:
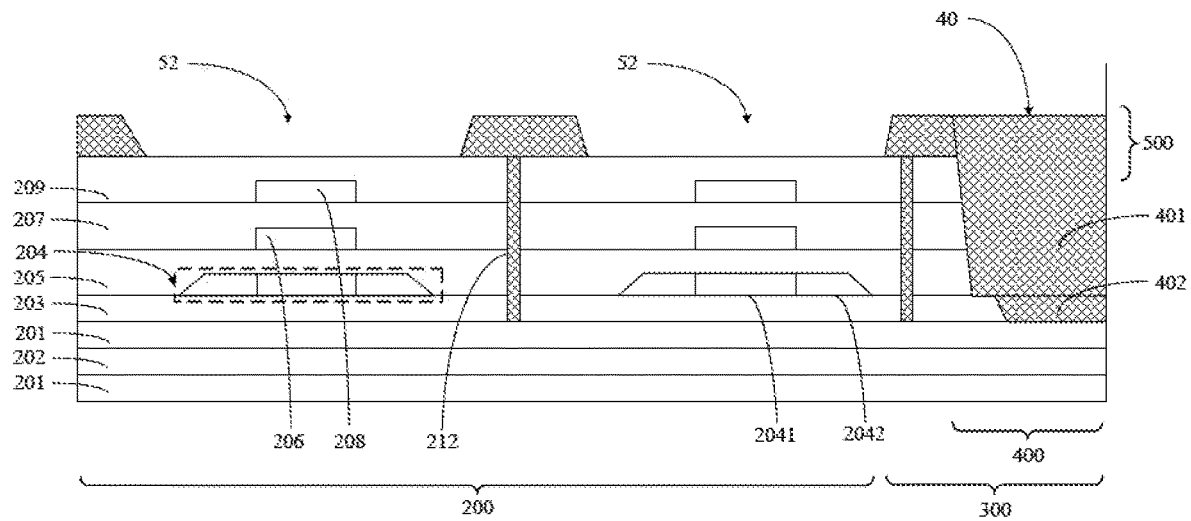

Referring to FIG. 2D, in this step, the flexible layer pattern 500 is mainly processed by a photomask process, and at least a third opening 52 is formed on the flexible layer 51 to form the flexible layer pattern 500.

The third opening 52 corresponds to at least one of the sources 2101 and at least one of the drains 2102.

Figure 2E:
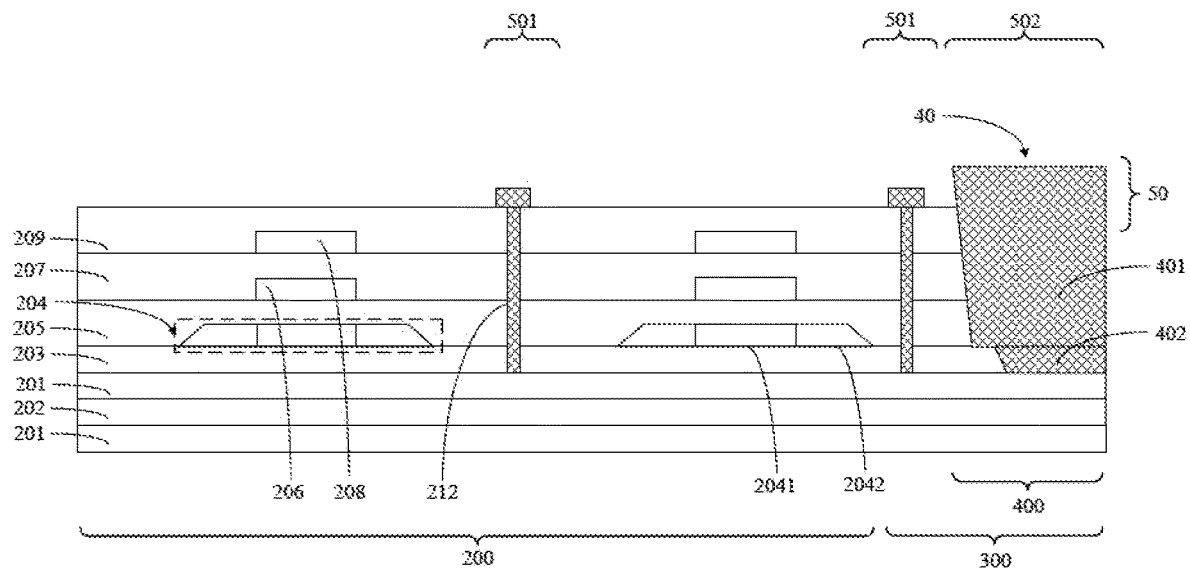

Referring to FIG. 2E, where the flexible layer pattern 500 is processed by a photomask process, and the flexible material corresponding to the first via 212 and the recess 40 are retained to form the flexible layer pattern 500.

The flexible layer 51 includes a first region 501 and a second region 502, the first region 501 corresponding to the first via 212 and the second region 502 corresponding to the recess 40.

In this embodiment, a thickness of the flexible layer 51 above the interlayer dielectric layer 209 in the first region 501 is less than a thickness of the flexible layer 51 above the interlayer dielectric layer 209 in the second region 502.

Figure 2F:
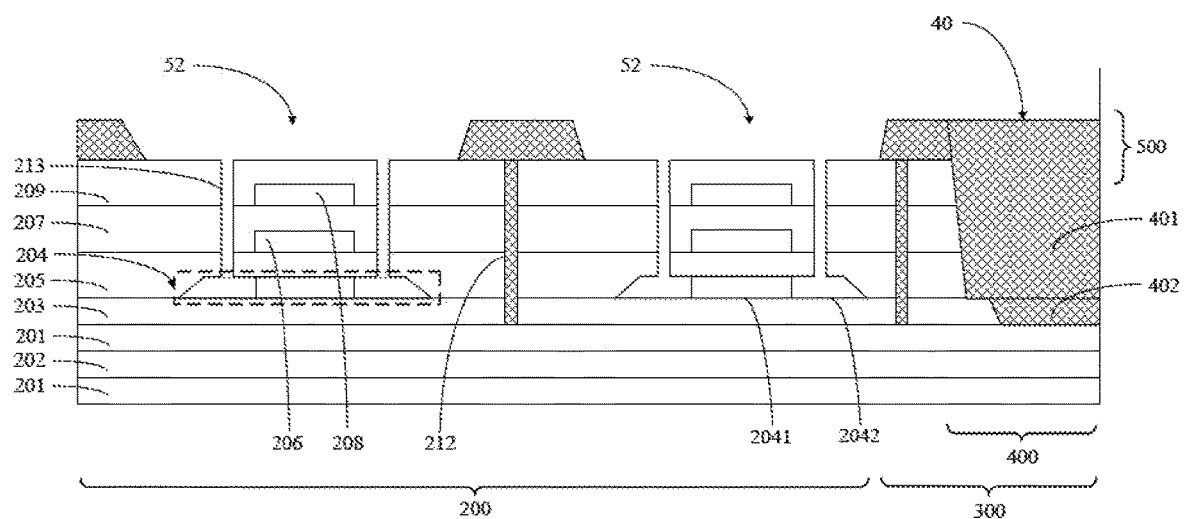

Referring to FIG. 2F, after processing of the flexible layer pattern 500, the fabricating method further includes:

on basis of structure shown in FIG. 2D, at least one second via 213 extending to the active layer 204 is formed in the third opening 52 by a third etching process to expose a portion of the active layer 204.

Figure 2G:
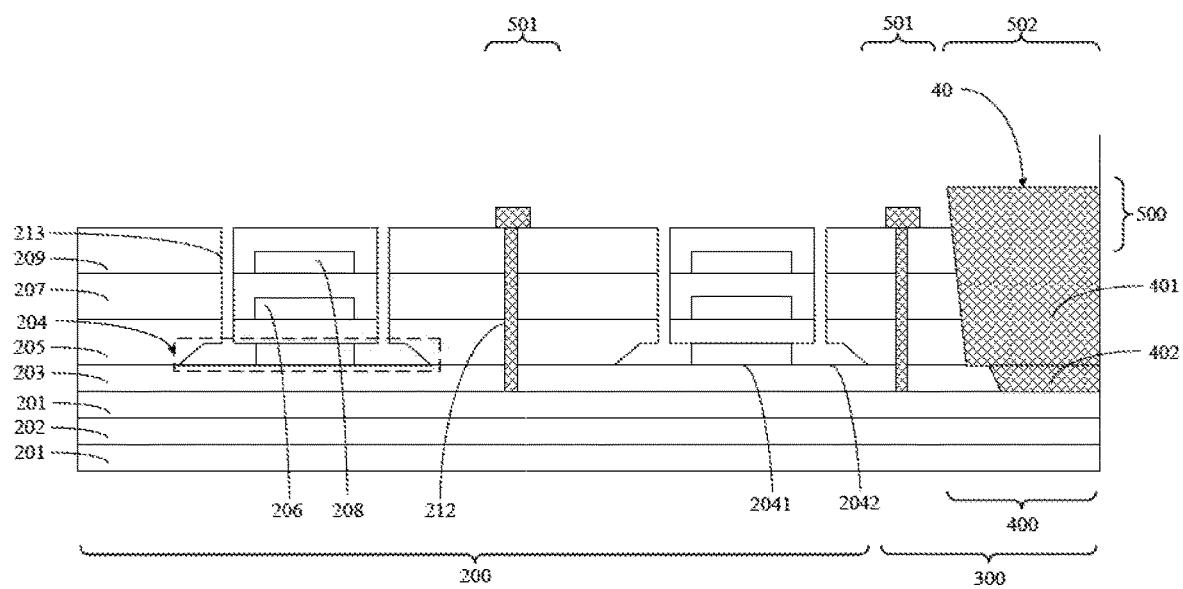

Please refer to FIG. 2G, where FIG. 2G is a structural diagram formed on basis of structure shown in FIG. 2E.

A step S50, forming sources 2101 and drains 2102 on the first insulating layer as a same layer as the flexible layer pattern 500.

Figure 2H:
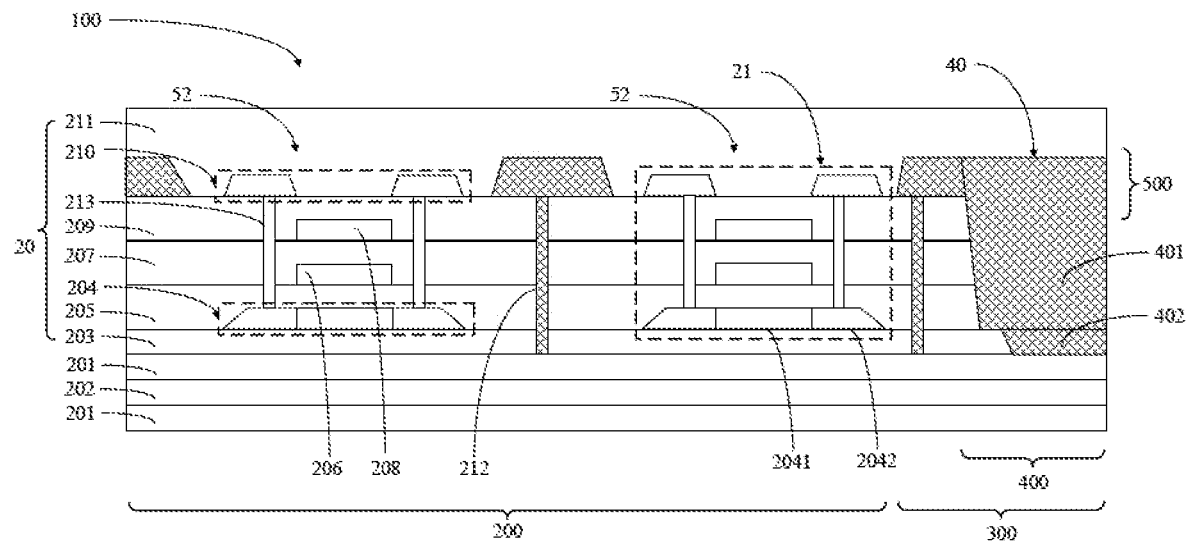

Referring to FIG. 2H, on basis of structure shown in FIG. 2F, this step mainly forms a pattern of the source-drain layer 210 of the display panel 100. The pattern of the source-drain layer 210 includes a plurality of sources 2101, a plurality of drains 2102, and a plurality of data lines perpendicular to a plurality of scan lines.

In this embodiment, the sources 2101 and/or the drains 2102 are arranged in the third opening 52.

The perimeter of the third opening 52 includes an inclined surface with a large angle to avoid break of the sources 2101 and/or the drains 2102 due to an excessive angle of bending.

Figure 2I:
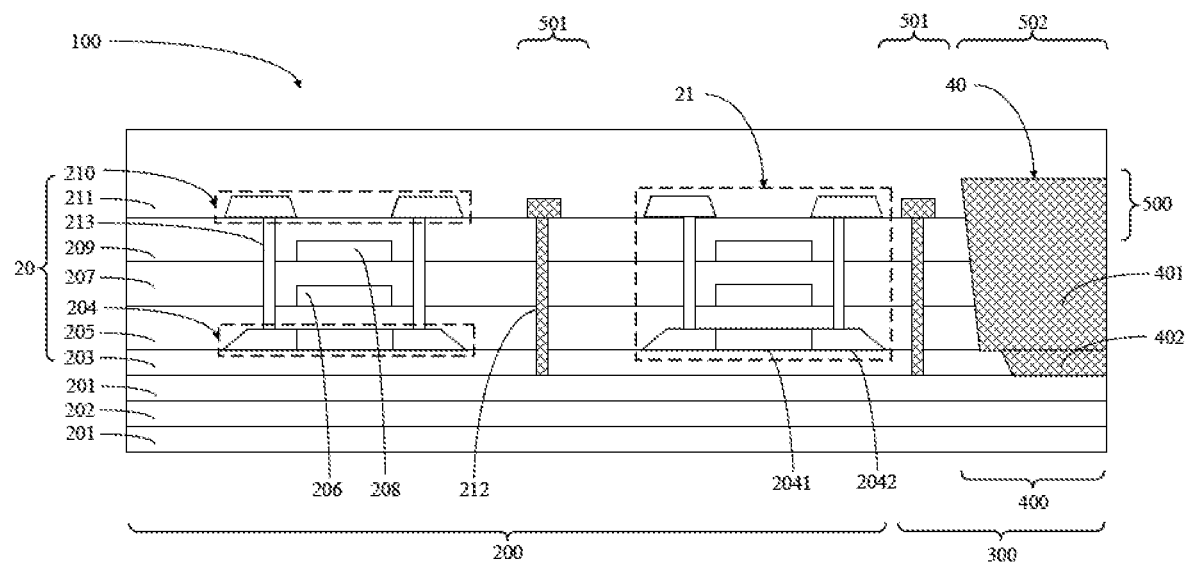

Please refer to FIG. 2I, where FIG. 2I is a structural diagram formed on basis of structure shown in FIG. 2G.

Since the flexible material merely exists in the first region 501 and the second region 502, there is no risk of disconnection in forming the sources 2101 and/or the drains 2102.

Figure 3:
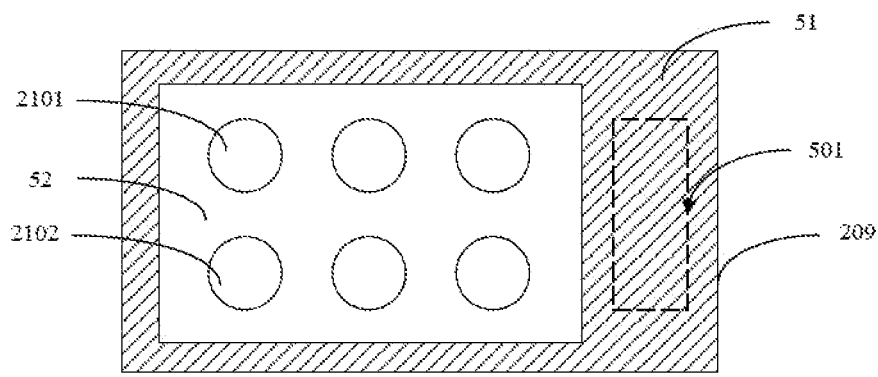
FIG. 3 is a top plane view of FIG. 2H.

Please refer to FIG. 3, where FIG. 3 is a top plane view of FIG. 2H.

Due to the existence of the flexible layer pattern 500, the distances between the sources 2101 and/or the drains 2102 and the active layer 204 are increased, which may result in a risk of disconnection when forming the sources 2101 and/or the drains 2102. However, in this embodiment, by forming the third opening 52 on the flexible layer pattern 500, the flexible material corresponding to positions of the sources 2101 and the drains 2102 are removed, therefore the distances between the sources 2101 and/or the drains 2102 and the active layer 204 are reduced, which avoids the risk of disconnection when forming the sources 2101 and the drains 2102.

The third opening 52 in this embodiment corresponds to the three sources 2101 and the three drains 2102.

Figure 4:
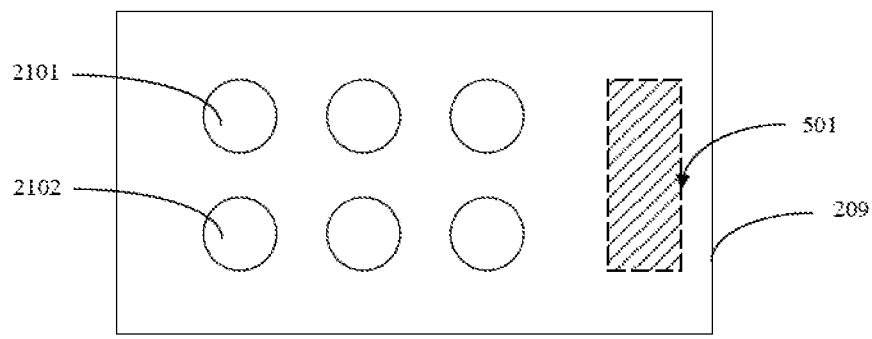
FIG. 4 is a top plane view of FIG. 2I.

Please refer to FIG. 4, where FIG. 4 is a top plane view of FIG. 2I.

In this embodiment, by removing the mostly flexible material in the display area 200, and retains the flexible material corresponding to the first via 212 and the recess 40, the distances between the sources 2101 and/or the drains 2102 and the active layer 204 maintain as conventional pitch, thereby avoiding the risk of disconnection while the sources 2101 and the drains 2102 are formed.

Before the pattern of the source-drain layer 210 is formed, the method further includes:

a protective layer formed on the flexible layer pattern 500.

The protective layer can be an inorganic protective layer. Due to the flexible layer pattern 500 is composed of an organic material, a large amount of heat is released and etching with an acidic solution is required while the pattern of the source-drain layer 210 is formed. High temperature and acidic solutions can deactivate organic materials and do not reduce the bending stress of flexible panels.

The display panel 100 further includes processes for a planarization layer 211, a light-emitting device layer (not shown), and an encapsulation layer (not shown) on the flexible layer pattern 500. Since those can be carried out using the conventional art, they will not be described again.

The present application removes the flexible material corresponding to positions of the sources 2101 and the drains 2102 by processing of the flexible layer pattern 500 on the interlayer dielectric layer 209, so that the sources 2101 and/or the drains 2102 are arranged in the openings, the distances between the sources 2101 and/or the drains 2102 and the active layer 204 are reduced, which avoids the risk of disconnection when forming the sources 2101 and the drains 2102, and improves product yield.

Figure 5:
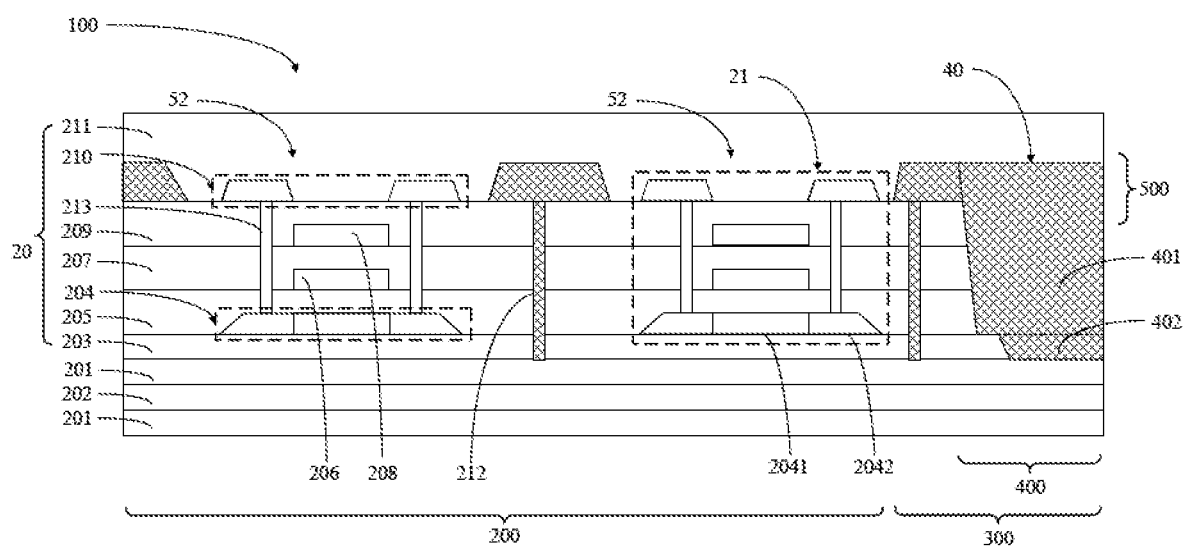
FIG. 5 is a first structural diagram of the display panel of the present application.

Please refer to FIG. 5, where FIG. 5 is a first structural diagram of the display panel 100 of the present application.

The display panel 100 includes the display area 200 and a non-display area 300 arranged at a periphery of the display area 200. The non-display area 300 includes the curved region 400 adjacent to the display area 200 and a bonding region away from the display area 200.

The substrate 201 and at least one recess 40 positioned on the substrate 201 are disposed in the curved region 400. The flexible material fills in the recess 40 to increase the bending resistance of the display panel 100.

In the present embodiment, a depth of the recess 40 extends from the source-drain layer 210 to the substrate 201.

The recess 40 includes a first opening 401 and a second opening 402. The first opening 401 is arranged on the second opening 402 and away from a side of the substrate 201.

In this embodiment, an orthographic projection area of the first opening 401 on the substrate 201 is greater than an orthographic projection area of the second opening 402 on the substrate 201.

The substrate 201 and a thin film transistor layer 2020 on the substrate 201 are disposed in the display area 200. The thin film transistor layer 2020 includes at least two thin film transistors 21.

In this embodiment, the substrate 201 can be a glass substrate, a quartz substrate, a resin substrate, and the like. The substrate 201 also can be a flexible substrate. A material of the flexible substrate can include polyimide. The substrate 201 can further increase flexibility of the substrate 201 by providing a two-layer polyimide layer.

The thin film transistor 21 can include a structure such as an etch barrier type, a back channel etch type or a top gate thin film transistor type 21, and is not particularly limited.

For example, the thin film transistor 21 of the top gate thin film transistor type 21 includes the barrier layer 202, the buffer layer 203, the active layer 204, the first gate insulating layer 205, the first gate layer 206, the second gate insulating layer 207, the second gate layer 208, the interlayer dielectric layer 209, the source-drain layer 210, and the planarization layer 211. In this embodiment, the first gate layer 206 and the second gate layer 208 can be collectively referred to as a gate layer pattern, the first gate insulating layer 205 and the second gate insulating layer 207, and the interlayer dielectric layer 209 can be collectively referred to as a first insulating layer.

The display panel 100 further includes at least one second via 213 disposed between the source-drain layer 210 and the active layer 204.

The display panel 100 further includes the light-emitting device layer (not shown) and the encapsulation layer (not shown) disposed on the planarization layer 211.

In the present embodiment, a two-layer flexible substrate 201 can be disposed, and the barrier layer 202 is arranged between the two-layer flexible substrates 201 to further increase flexibility of the display panel 100.

Referring to FIG. 5, the display panel 100 further includes at least one first via 212. The first via 212 is filled with the flexible material same as the flexible layer pattern 500.

In this embodiment, the first via 212 can be formed in two etching processes same as the recess 40. Or the first via 212 is formed in a third etching process, which is not specifically limited thereto.

In this embodiment, the recess 40 and the first via 212 penetrate the interlayer dielectric layer 209, the second gate insulating layer 207, the first gate insulating layer 205, and the buffer layer 203.

In this embodiment, at least one first via 212 can be disposed between adjacent two thin film transistors 21. Alternatively, at least one of the thin film transistors 21 is disposed between two adjacent first vias 212. The number of the first via 212 is not specifically limited thereto.

Referring to FIG. 5, the display panel 100 can further include the flexible layer pattern 500 on the interlayer dielectric layer 209.

The flexible layer pattern 500 includes at least a third opening 52. In this embodiment, at least one of the sources 2101 and at least one of the drains 2102 are arranged in the third opening 52.

In this embodiment, the perimeter of the third opening 52 includes an inclined surface with small angle to prevent the angle from being too large so that metal particles cannot be deposited on the inclined surface and disconnection of the sources 2101 and/or the drains 2102 are caused.

Referring to FIG. 3, due to the existence of the flexible layer pattern 500, the distances between the sources 2101 and/or the drains 2102 and the active layer 204 are increased, resulting in a risk of disconnection when forming the sources 2101 and/or the drains 2102. However, in this embodiment, by forming the third opening 52 on the flexible layer pattern 500, the flexible material corresponding to positions of the sources 2101 and the drains 2102 are removed, therefore the distances between the sources 2101 and/or the drains 2102 and the active layer 204 are reduced, which avoids the risk of disconnection when forming the sources 2101 and the drains 2102. The third opening 52 in this embodiment corresponds to the three sources 2101 and the three drains 2102.

Figure 6:
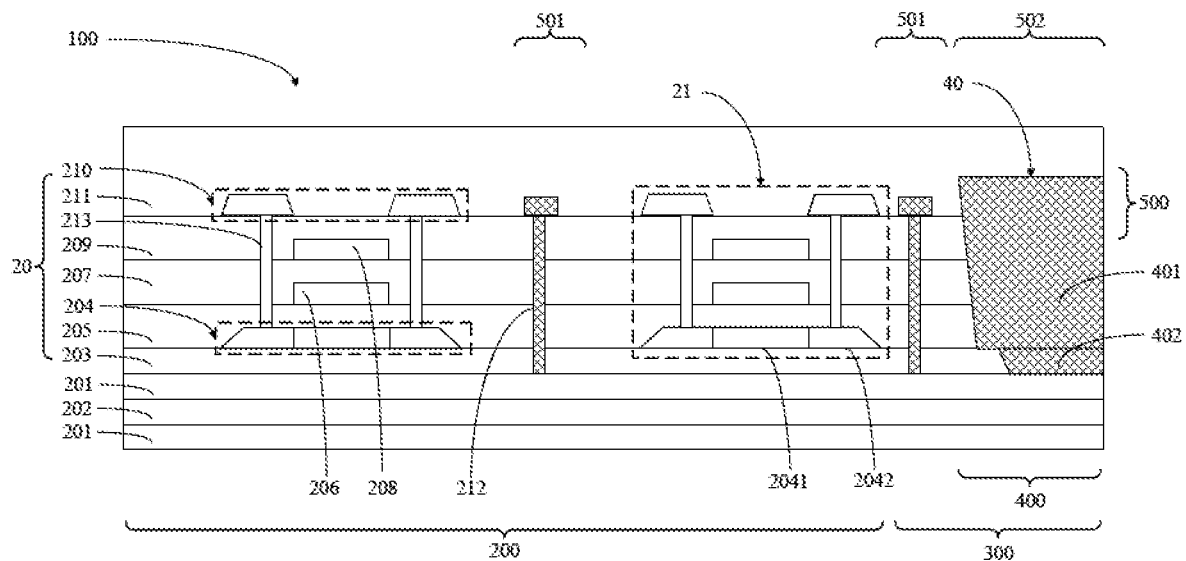
FIG. 6 is a second structural diagram of the display panel of the present application.

Please refer to FIG. 6, where FIG. 6 is a second structural diagram of the display panel 100 of the present application.

This embodiment is same as or similar to structure as shown in FIG. 5, the difference is that:

in this embodiment, the flexible layer pattern 500 is performed by the photomask process, retains the flexible material corresponded to positions of the first via 212 and the recess 40, so that the flexible layer 51 formed with the first region 501 and the second region 502. The first region 501 corresponds to the first via 212, and the second region 502 corresponds to the recess 40.

In this embodiment, the thickness of the flexible layer 51 above the interlayer dielectric layer 209 in the first region 501 is less than the thickness of the flexible layer 51 above the interlayer dielectric layer 209 in the second region 502.

In this embodiment, by removing the mostly flexible material in the display area 200, and retains the flexible material corresponding to the first via 212 and the recess 40, the distances between the sources 2101 and/or the drains 2102 and the active layer 204 maintain as conventional pitch, thereby avoiding the risk of disconnection while the sources 2101 and the drains 2102 are formed.

Figure 7:
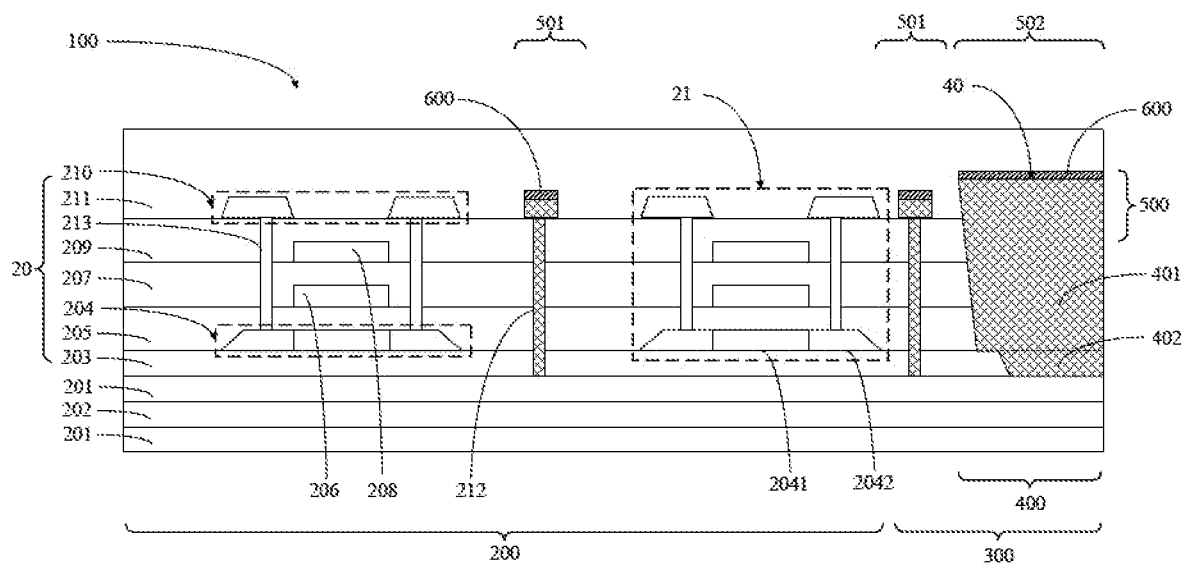
FIG. 7 is a third structural diagram of the display panel of the present application.

Please refer to FIG. 7, where FIG. 7 is a third structural diagram of the display panel 100 of the present application.

This embodiment will be described by way of example on basis of the structure shown in FIG. 6.

The display panel 100 further includes the protective layer 600 disposed on a side of the flexible layer pattern 500 away from the substrate 201. The protective layer can be an inorganic protective layer.

Due to the flexible layer pattern 500 is composed of the organic material, large amount of heat is released and etching with an acidic solution is required while the pattern of the source-drain layer 210 is formed. High temperature and acidic solutions can deactivate organic materials and do not reduce the bending stress of flexible panels.

The present application also provides a display module, which includes one of the above display panels, and a polarizer layer and a cover layer disposed on the display panel. The working principle of the display module is same as or similar to that of the display panel, and is not described herein.

The present application provides a display panel and a method for fabricating the same. The display panel includes the substrate, the first insulating layer on the substrate, the source-drain layer on the first insulating layer, and the flexible layer pattern. The source-drain layer includes the sources and the drains. The flexible layer pattern includes at least one opening, the sources and the drains of the display panel are arranged in the openings, and the at least one opening corresponds to at least one of the sources and at least one of the drains. The present application utilizes the process of patterning the flexible layer on the interlayer dielectric layer to remove the flexible material corresponding to positions of the sources and the drains, so that the sources and/or the drains are arranged in the openings, the distances between the sources and/or the drains and the active layer are reduced, which avoids the risk of disconnection when forming the sources and the drains, and improves product yield.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method of fabricating a display panel, comprising: forming a gate layer pattern on a substrate and a first insulating layer on the gate layer pattern; forming at least one recess and at least one first via on the display panel by an etching process; forming a flexible layer on the first insulating layer, the flexible layer filling the at least one first via and the at least one recess; patterning the flexible layer to remove a portion of a flexible material in a display area of the display panel to form a flexible layer pattern; and forming sources and drains on the first insulating layer as a same layer as the flexible layer pattern; wherein patterning the flexible layer to remove the portion of the flexible material in the display area of the display panel to form the flexible layer pattern comprises: patterning the flexible layer by a photomask process, forming at least a third opening on the flexible layer to form the flexible layer pattern; the third opening corresponded to at least one of the sources and at least one of the drains.

2. The method of fabricating the display panel of claim 1, wherein forming the at least one recess and the at least one first via on the display panel by the etching process comprises:
forming a first opening in a curved region of the display panel by a first etching process;
forming a second opening in the curved region of the display panel by a second etching process;
wherein an orthographic projection area of the first opening on the substrate is greater than an orthographic projection area of the second opening on the substrate.

3. The method of fabricating the display panel of claim 1, wherein the display panel comprises at least two thin film transistors, the at least one first via is disposed between the two adjacent thin film transistors, or at least one of thin film transistors is disposed between two adjacent first vias.

4. The method of fabricating the display panel of claim 1, wherein patterning the flexible layer to remove the portion of the flexible material in the display area of the display panel to form the flexible layer pattern comprises:
patterning the flexible layer by a photomask process, retaining the flexible material corresponded to the at least one recess and the at least one first via to form the flexible layer pattern;
wherein the flexible layer comprises a first region and a second region, the first region corresponds to the at least one first via, and the second region corresponds to the at least one recess.

5. The method of fabricating the display panel of claim 1, wherein the display panel further comprises a protective layer on a side of the flexible layer pattern away from the substrate.

6. A display panel, comprising: a substrate; a first insulating layer disposed on the substrate; a source-drain layer and a flexible layer pattern disposed on the first insulating layer; wherein the source-drain layer comprises sources and drains, the flexible layer pattern comprises at least one opening, the sources and the drains of the display panel are arranged in the openings, and the at least one opening corresponds to at least one of the sources and at least one of the drains; wherein the flexible layer pattern comprises at least a third opening, at least one of the sources and at least one of the drains are arranged in the third opening, the third opening further comprises an inclined surface, and the third opening is disposed in a same layer as the at least one of the sources or the at least one of the drains; further comprising: at least one first via, wherein the at least one first via is filled with a flexible material same as the flexible layer pattern; at least two adjacent thin film transistors, wherein the at least one first via is disposed between the two adjacent thin film transistors, or at least one of thin film transistors is disposed between two adjacent first vias.

7. The display panel of claim 6, further comprising a curved region, wherein at least one recess is disposed in the curved region, the at least one recess is filled with a flexible material same as the flexible layer pattern, and the at least one recess comprises a second opening and a first opening disposed on the second opening, wherein an orthographic projection area of the first opening on the substrate is greater than an orthographic projection area of the second opening on the substrate.

8. The display panel of claim 6, wherein the flexible layer pattern comprises a first region corresponding to the at least one first via and a second region corresponding to at least one recess.

9. The display panel of claim 6, further comprising a protective layer disposed on a side of the flexible layer pattern away from the substrate.

10. A display module, comprising a display panel, and a polarizer layer and a cover layer disposed on the display panel, the display panel comprising: a substrate; a first insulating layer disposed on the substrate; a source-drain layer and a flexible layer pattern disposed on the first insulating layer; wherein the source-drain layer comprises sources and drains, the flexible layer pattern comprises at least one opening, the sources and the drains of the display panel are arranged in the openings, and the at least one opening corresponds to at least one of the sources and at least one of the drains; wherein the flexible layer pattern comprises at least a third opening, at least one of the sources and at least one of the drains are arranged in the third opening, the third opening further comprises an inclined surface, and the third opening is disposed in a same layer as the at least one of the sources or the at least one of the drains; wherein the display panel further comprises at least one first via, the at least one first via filled with a flexible material same as the flexible layer pattern, and at least two adjacent thin film transistors, the at least one first via disposed between the two adjacent thin film transistors, or at least one of thin film transistors disposed between two adjacent first vias.

11. The display module of claim 10, wherein the display panel further comprises a curved region, at least one recess is disposed in the curved region, and the at least one recess is filled with a flexible material as the flexible layer pattern, wherein the at least one recess further comprises a second opening and a first opening disposed on the second opening, and an orthographic projection area of the first opening on the substrate is greater than an orthographic projection area of the second opening on the substrate.

12. The display module of claim 10, wherein the flexible layer pattern comprises a first region corresponding to the at least one first via and a second region corresponding to at least one recess.

13. The display module of claim 10, wherein the display panel further comprises a protective layer disposed on a side of the flexible layer pattern away from the substrate.

* * * * *